United States Patent [19]

Walton

[11] Patent Number: 5,339,007
[45] Date of Patent: Aug. 16, 1994

[54] INSECT KILLERS

[75] Inventor: Colin R. G. Walton, Birmingham, United Kingdom

[73] Assignee: Apco International Limited, Herfordshire, England

[21] Appl. No.: 912,348

[22] Filed: Jul. 13, 1992

[30] Foreign Application Priority Data

Jul. 11, 1991 [GB] United Kingdom ............... 9114935.1
Aug. 30, 1991 [GB] United Kingdom ............... 9118576.9

[51] Int. Cl.[5] ...................... H05B 37/00; A01M 1/22
[52] U.S. Cl. .................................. 315/205; 315/276; 315/209 R; 43/112
[58] Field of Search ................ 43/112; 315/205, 276, 315/209 R

[56] References Cited

U.S. PATENT DOCUMENTS 3,473,251 10/1969 Kahn ..................... 43/112
3,935,662 2/1976 Hamid et al. ............ 43/112
3,986,292 10/1976 Klebanoff ............... 43/112

OTHER PUBLICATIONS

U.K. Search Report for GB 9114935.1, date of search, Nov. 10, 1992.
U.K. Search Report for GB 9118576.9, date of search, Nov. 10, 1992.
GB 2242323 A to Cheng, cited in search of GB 9118576.9. Date of search Nov. 10, 1992.
GB 1513190 A to Thorne, cited in search of GB 9118576.9. Date of search Nov. 10, 1992.

Primary Examiner—Robert J. Pascal
Assistant Examiner—Michael B. Shingleton
Attorney, Agent, or Firm—Trexler, Bushnell, Giangiorgi & Blackstone, Ltd.

[57] ABSTRACT

An insect killer has a discharge lamp and its ballast inductor connected in series with a capacitor and the primary winding of a pulse transformer, the secondary winding of which is connected to a high voltage grid. A triac is connected across the series combination of the capacitor and the primary winding and is fired periodically to cause the capacitor to be discharged through the primary winding to impose a high voltage on the grid. By using the ballast inductor to control charging of the capacitor the power dissipation level of the insect killer is minimized.

4 Claims, 1 Drawing Sheet

INSECT KILLERS

This invention relates to insect killers of the type which employ a discharge lamp surrounded by a high-voltage grid such that insects attracted by the lamp into contact with the grid are electrocuted.

In conventional insect killers of this type the high voltage on the grid is supplied by a step-up mains transformer which tends to be bulky, heavy and expensive. It has already been proposed to replace the mains transformer with a simpler, lighter pulse transformer through the primary winding of which a capacitor is discharged periodically. This prior proposal, however, makes use of a resistive load for controlling charging of the capacitor and, in practice, such resistive load is required to dissipate a significant additional amount of heat-say 15 to 20 watts. As a result the space which could be achieved by the substitution of a pulse transformer for the mains transformer cannot, in fact, be achieved.

It is an object of the invention to provide an insect killer in which the above-mentioned disadvantages are avoided.

An insect killer in accordance with the invention is characterised by employing the discharge lamp and its ballast choke connected in series with the capacitor so as to form the charging path therefor.

With this arrangement no resistive load is required and there is no additional heat to be dissipated.

Moreover, a further advantage over the prior art constructions is obtained, in that, should the discharge tube fail, no high voltage will be impressed on the With the prior art constructions, in which the high voltage supply is connected in parallel with the discharge tube circuit, the high voltage remains present on the grid when the discharge tube fails and a user may not be aware that the device is switched on.

In accordance with the invention, an insect killer comprises a discharge lamp, a grid towards which flying insects are attracted by said lamp and an energising circuit for said grid, said energising circuit comprising a step-up pulse transformer having a secondary winding connected to the grid and a primary winding, a discharge capacitor, a trigger device connected in series with said primary winding across said discharge capacitor and a charging circuit for said discharge capacitor, said charging circuit comprising a full wave voltage-doubler circuit.

Said full-wave voltage-doubler circuit may comprise a common input resistor, a pair of input capacitors and two pairs of diodes, said input capacitors being connected via said common input resistor to one supply terminal and via respective ones of one of the diode pairs to the other supply terminal, said diodes of said one diode pair being oppositely connected so that the capacitors can charge in alternate half-cycles of the supply, the diodes of the other diode pair connecting the input capacitors to opposite sides of the discharge capacitor.

With this arrangement the discharge capacitor is charged in the same sense on each supply half cycle. The trigger device can therefore be a uni-directional device such as a thyristor instead of a triac which would be required if bi-directional current flow were required.

BRIEF DESCRIPTION OF THE DRAWINGS

In the accompanying drawings

Figure 1:
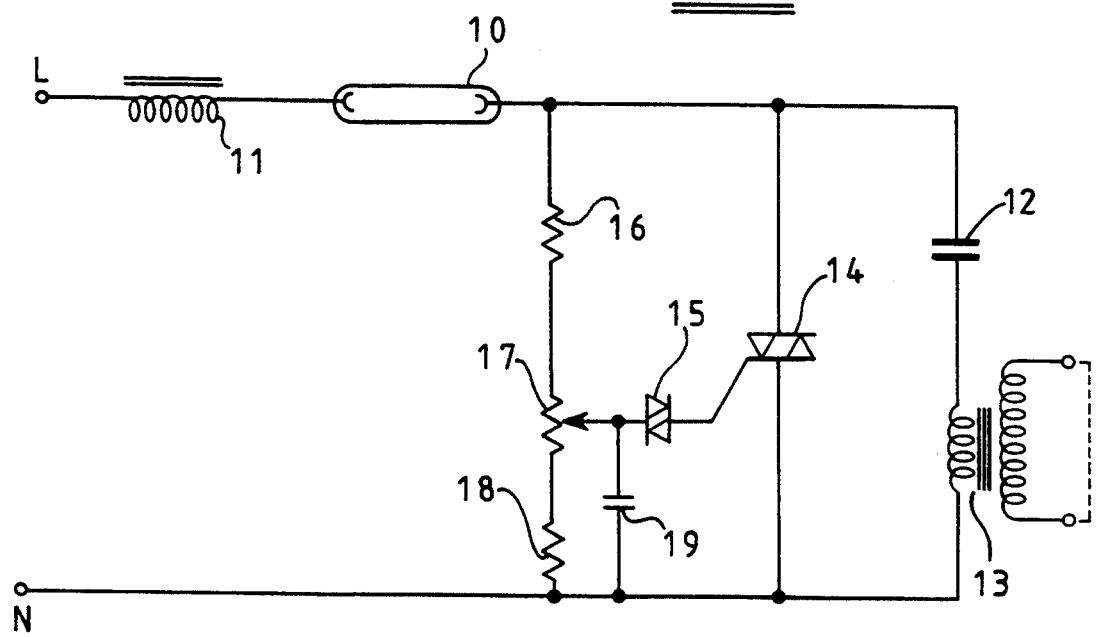
FIGS. 1 and 2 are electrical circuit diagrams of two examples of insect killers in accordance with the invention.

In the example shown in FIG. 1, the insect killer comprises a discharge tube, for example an ultraviolet radiation type discharge tube which is connected in series with a ballast choke 11, a capacitor 12 and the primary winding of a pulse transformer 13, this series combination being connected between mains supply terminals L and N.

A triac 14 is connected across the series combination of the capacitor 12 and the winding 13. The gate of the triac 14 is connected via a dias 15 to a point on a resistive potential divider chain 16, 17, 18 (which may include a potentiometer or variable resistor) connected across the triac 14. A capacitor 19 connects that terminal of the dias which is not connected to the gate of the triac to the mains terminal N.

In use, once the starter arrangement (not shown) for the tube 10 has operated, current flows on each mains half-cycle through the choke 11 and the tube 10 into the capacitor, the capacitive value of which is chosen in relation to the inductive value of the choke 11 so as to ensure that current flow into the capacitor 12 is limited. When the voltage across the capacitor 12 reaches a predetermined value the dias 15 conducts and causes the triac 14 to be triggered. A short pulse of current thus flows through the primary winding of pulse transformer 13, thereby inducing a high voltage in its secondary winding which is connected to the grid of the insect killer. The inductance of the primary winding of the transformer 13 is very small compared with that of the choke 11 so that a short duration pulse is obtained.

The above described insect killer circuit can be made in a very compact form and encapsulated in a suitable resin, as no significant amount of heat needs to be dissipated.

Figure 2:
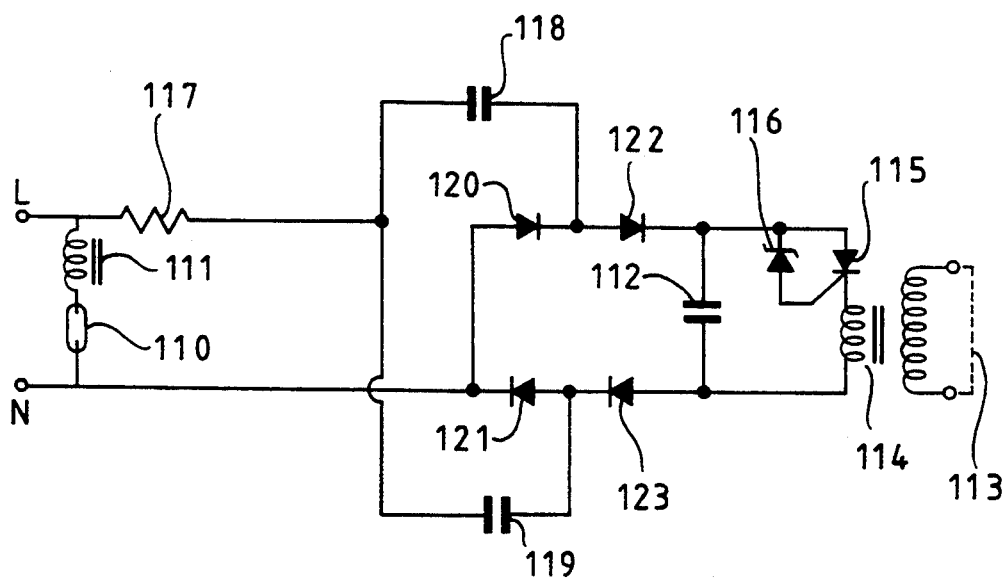

In the example shown in FIG. 2, terminals L and N are intended for connection to a.c. mains for providing power for the insect killer. A discharge lamp 110 is connected in series with a ballast choke 111 between these terminals. The terminals L and N are also connected to a full-wave voltage-doubler for charging a discharge capacitor 112. This capacitor 112 is used for energising a grid which is arranged in well-known manner to surround the lamp 110 so that insects flying towards the lamp 110 touch the grid and are electrocuted. The grid 113 is connected across the secondary winding of a pulse transformer 114, the primary winding of which is connected in series with a triggering device 115 (in the form of a thyristor) across the discharge capacitor 112. A zener diode 116 connects the anode and gate of the thyristor together so that whenever, the anode/gate voltage exceeds the zener breakdown voltage the thyristor is fired.

The full-wave voltage-doubler circuit employed makes use of two conventional voltage-doublers sharing a common input resistor 117 and having the discharge capacitor 112 as a common output capacitor. Two input capacitors 118 and 119 and four diodes 120 to 123 make up the circuit. Capacitors 118 and 119 each have one terminal connected to one end of the input resistor, the other end of which is connected to the terminal L. The other terminals of capacitors 118, 119 are connected by respective diodes 120 and 121 to the terminal N, the diodes 120 and 121 being oppositely connected so that charging current flows into the capacitors 118 and 119 in alternate half-cycles of the a.c. supply. The remaining two diodes 122 and 123 connect the other terminals of capacitors 118, 119 to opposite sides of the capacitor 112. Thus, as will be seen from the drawing, one side of capacitor 112 is connected to terminal N by the two diodes 120, 122 in series and the other side thereof is connected to terminal N by the other two diodes 121, 123 in series, the four diodes forming a single series circuit connected across the capacitor 112 with all the diodes in this series circuit being connected in the same sense.

In operation, a situation where all four diodes are forwardly biassed simultaneously cannot occur, as in every half-cycle one or other of the diodes 120, 121 will be reversed biassed. During negative half-cycles capacitor 118 charges so that a negative voltage appears on its input side terminal. When the next half cycle is commenced, this input side terminal is forced to a positive voltage so that output side terminal of capacitor 118 is forced to an increasingly positive voltage and voltage is transferred to the "upper" side capacitor 112. During each positive half-cycle capacitor 119 is charged in the opposite sense so that when the succeeding negative half cycle is commenced the voltage on the "lower" side of capacitor 112 is forced in a negative direction.

In each half cycle, when the voltage on capacitor 112 becomes high enough, thyristor 115 fires and the capacitor 112 discharges rapidly through the transformer primary winding.

The arrangement described in relation to FIG. 2 above enables a high voltage to be maintained efficiently on the grid without reducing the voltage across the lamp. Power consumption is minimised and no heavy, bulky mains frequency transformer is required.

What is claimed is:

1. An insect killer comprising a discharge lamp, a grid towards which flying insects are attracted by said lamp and an energising circuit for said grid, said energising circuit comprising a step-up pulse transformer having a secondary winding connected to the grid and a primary winding, a discharge capacitor, a trigger device connected in series with said primary winding and in parallel with said discharge capacitor and a charging circuit for said discharge capacitor, said charging circuit comprising a full wave voltage-doubler circuit.

2. An insect killer as claimed in claim 1, in which said voltage-doubler circuit comprises a common input resistor, a pair of input capacitors and two pairs of diodes, said input capacitors being connected via said common input resistor to one supply terminal and via respective ones of one of the diode pairs to a second supply terminal, said diodes of said one diode pair being oppositely connected so that the input capacitors can charge in alternate half-cycles of the supply, the diodes of the other diode pair connecting the input capacitors to opposite sides of the discharge capacitor.

3. An insect killer as claimed in claim 2, in which said trigger device is a uni-directional current flow device.

4. An insect killer as claimed in claim 2, in which said trigger device is a thyristor.

* * * * *